US012230505B2

(12) United States Patent
Tsuji et al.

(10) Patent No.: US 12,230,505 B2
(45) Date of Patent: Feb. 18, 2025

(54) ETCHING APPARATUS

(71) Applicant: TOKYO ELECTRON LIMITED, Tokyo (JP)

(72) Inventors: Akihiro Tsuji, Miyagi (JP); Masanobu Honda, Miyagi (JP); Hikaru Watanabe, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 416 days.

(21) Appl. No.: 17/677,752

(22) Filed: Feb. 22, 2022

(65) Prior Publication Data

US 2022/0181162 A1      Jun. 9, 2022

Related U.S. Application Data

(62) Division of application No. 16/069,995, filed as application No. PCT/JP2017/018340 on May 16, 2017, now abandoned.

(30) Foreign Application Priority Data

May 19, 2016   (JP) ................................. 2016-100603

(51) Int. Cl.
    *H01L 21/00*       (2006.01)
    *H01L 21/027*     (2006.01)
    (Continued)

(52) U.S. Cl.
    CPC .... *H01L 21/31116* (2013.01); *H01L 21/0276* (2013.01); *H01L 21/0332* (2013.01);
    (Continued)

(58) Field of Classification Search
    CPC ........... H01L 21/31116; H01L 21/0276; H01L 21/0332; H01L 21/31138; H01L 21/31144;
    (Continued)

(56) References Cited

U.S. PATENT DOCUMENTS 6,716,766 B2    4/2004   Ko
7,708,859 B2    5/2010   Huang et al.
(Continued)

FOREIGN PATENT DOCUMENTS

CN    104851794 A    8/2015
CN    105390388 A    3/2016
(Continued)

OTHER PUBLICATIONS

International Search Report for corresponding International Application No. PCT/JP2017/018340 mailed Jul. 11, 2017; 2 pp. (with English Translation).

*Primary Examiner* — Aiden Lee
(74) *Attorney, Agent, or Firm* — XSENSUS LLP

(57) ABSTRACT

An apparatus which selectively etches a first region with respect to a second region made of a material different from that of the first region. The apparatus is controlled to perform a first step for generating, in a processing container housing a workpiece to be treated, a plasma of a treatment gas from a gas supply including a fluorocarbon gas, an oxygen-containing gas, and an inert gas, and forming a deposit including fluorocarbon on the object to be treated, and a second step for etching the first region with radicals of the fluorocarbon included in the deposit. The apparatus is also controlled to perform the first step and the second step repeatedly.

11 Claims, 17 Drawing Sheets

(51) Int. Cl.
*H01L 21/033* (2006.01)
*H01L 21/311* (2006.01)
*H01L 21/768* (2006.01)
*H01L 21/8234* (2006.01)
*H01L 21/67* (2006.01)
*H01L 21/683* (2006.01)

(52) U.S. Cl.
CPC .. *H01L 21/31138* (2013.01); *H01L 21/31144* (2013.01); *H01L 21/76802* (2013.01); *H01L 21/76897* (2013.01); *H01L 21/823475* (2013.01); *H01L 21/67069* (2013.01); *H01L 21/6833* (2013.01); *H01L 21/823431* (2013.01); *H01L 2221/1063* (2013.01)

(58) Field of Classification Search
CPC ......... H01L 21/76802; H01L 21/76897; H01L 21/823475; H01L 21/67069; H01L 21/6833; H01L 21/823431; H01L 2221/1063; H01L 29/66795; H01L 21/3065
See application file for complete search history.

(56) References Cited

U.S. PATENT DOCUMENTS

| | | | |
|---|---|---|---|
| 10,658,189 B2 * | 5/2020 | Hatazaki | H01L 21/67069 |
| 2004/0195216 A1 | 10/2004 | Strang | |
| 2013/0119018 A1 | 5/2013 | Kanarik et al. | |
| 2014/0124139 A1 * | 5/2014 | Koshiishi | H01J 37/32834 |
| | | | 156/345.28 |
| 2016/0064247 A1 * | 3/2016 | Tomura | H01L 21/31144 |
| | | | 438/700 |
| 2022/0051904 A1 * | 2/2022 | Watanabe | H01L 21/76813 |

FOREIGN PATENT DOCUMENTS

| | | |
|---|---|---|
| JP | 2000-307001 A | 11/2000 |
| JP | 2016-048771 A | 4/2016 |
| KR | 10-2016-0028370 A | 3/2016 |

\* cited by examiner

ETCHING APPARATUS

CROSS REFERENCE TO RELATED APPLICATION

This application is a divisional of U.S. patent application Ser. No. 16/069,995, filed Jul. 13, 2018, which is a National Phase Entry Application from PCT/JP2017/018340, filed May 16, 2017, claiming priority from Japanese Patent Application No. 2016-100603, filed May 19, 2016, the disclosures of which are incorporated herein in their entirety by reference and priority is claimed to each.

TECHNICAL FIELD

An exemplary embodiment of the present disclosure relates to a method for selectively etching a first region made of silicon oxide with respect to a second region made of silicon nitride by a plasma processing on a workpiece.

BACKGROUND

In manufacturing electronic devices, a processing may be performed on a region made of silicon oxide ($SiO_2$) to form openings (e.g., holes or trenches) in some cases. In such a processing, a workpiece is generally exposed to plasma of a fluorocarbon gas, so that the exposed region is etched, as described in Patent Document 1.

Further, a technique for selectively etching a first region made of silicon oxide with respect to a second region made of silicon nitride has been known. As an example of the technique, a self-aligned contact (SAC) technique has been known. The SAC technique is described in Patent Document 2.

A workpiece, which is a processing target of the SAC technique, includes a first region made of silicon oxide, a second region made of silicon nitride, and a mask. The second region is provided to define a recess, the first region is provided to fill the recess and cover the second region, and the mask is provided on the first region and provides an opening above the recess. In the SAC technique of the related art, as described in Patent Document 2, plasma of a processing gas containing a fluorocarbon gas, oxygen gas, and a noble gas is used for etching the first region. When the workpiece is exposed to the plasma of the processing gas, the first region is etched in a portion exposed from the opening of the mask, forming an upper opening. Further, since the workpiece is exposed to the plasma of the processing gas, the first region in a portion surrounded by the second region, that is, in the recess, is etched in a self-aligned manner. Thus, a lower opening continuous with the upper opening is formed in a self-aligned manner.

PRIOR ART DOCUMENT

Patent Document

Patent Document 1: U.S. Pat. No. 7,708,859
Patent Document 2: Japanese Patent Laid-Open Publication No. 2000-307001

DISCLOSURE OF THE INVENTION

Problems to be Solved

In the related art described above, there occurs a state where a film for protecting the second region is not formed on the surface of the second region at the time when the etching of the first region proceeds and the second region is exposed. When etching of the first region is performed in this state, wear occurs in the second region.

Therefore, it is required to etch the first region made of silicon oxide while suppressing wear of the second region made of silicon nitride.

Means to Solve the Problems

In an aspect, the present disclosure provides a method for selectively etching a first region made of silicon oxide to a second region made of silicon nitride by a plasma processing on a workpiece. The workpiece includes the second region configured to define a recess, the first region provided to fill the recess and cover the second region, and a mask provided on the first region, and the mask provides, over the recess, an opening having a width greater than the width of the recess. The method includes (a) a first step of generating plasma of a processing gas containing a fluorocarbon gas, an oxygen-containing gas, and an inert gas in a processing container accommodating the workpiece to form a deposit containing fluorocarbon on the workpiece; and (b) a second step of etching the first region with radicals of the fluorocarbon contained in the deposit. A sequence including the first step and the second step is repeatedly executed.

Since this method includes the second step of selectively etching the first region made of silicon oxide by radicals of fluorocarbon, the first region is etched, and the second region made of silicon nitride is suppressed from being worn. In the first step, a deposit is formed by plasma of a processing gas containing a fluorocarbon gas and an inert gas, or plasma of a processing gas containing a fluorocarbon gas, an oxygen-containing gas, and an inert gas. Formation of the deposit and appropriate reduction of the amount of the deposit are carried out in the first step, and it is not necessary to switch the processing gas. Thus, it is not necessary to consider the stabilization time accompanying the switching of the processing gas and the discharge stabilization time.

In an exemplary embodiment of the method, the etching of the second step is performed with a substantially oxygen-free processing gas. In this method, the selective etching of the first region with respect to the second region is efficiently performed. By "substantially oxygen-free" is meant that oxygen is not intentionally introduced into the processing gas.

In an exemplary embodiment, each of one or more first sequences, one or more second sequences, and one or more third sequences may further includes a third step. In the third step, plasma of a processing gas containing an oxygen-containing gas and an inert gas is generated in the processing container that accommodates the workpiece. According to the exemplary embodiment, the amount of the deposit formed on the workpiece may be appropriately reduced by active species of oxygen. Therefore, it is possible to suppress the opening of the mask and the opening formed by etching from being clogged. Further, in the exemplary embodiment, since the oxygen-containing gas is diluted with the inert gas in the processing gas, excessive removal of the deposit may be suppressed.

Effect of the Invention

As described above, it is possible to etch the first region made of silicon oxide while suppressing wear of the second region made of silicon nitride.

DETAILED DESCRIPTION TO EXECUTE THE INVENTION

Hereinafter, various exemplary embodiments will be described in detail with reference to the drawings. In the respective drawings, the same or corresponding parts will be denoted by the same symbols.

Figure 1:
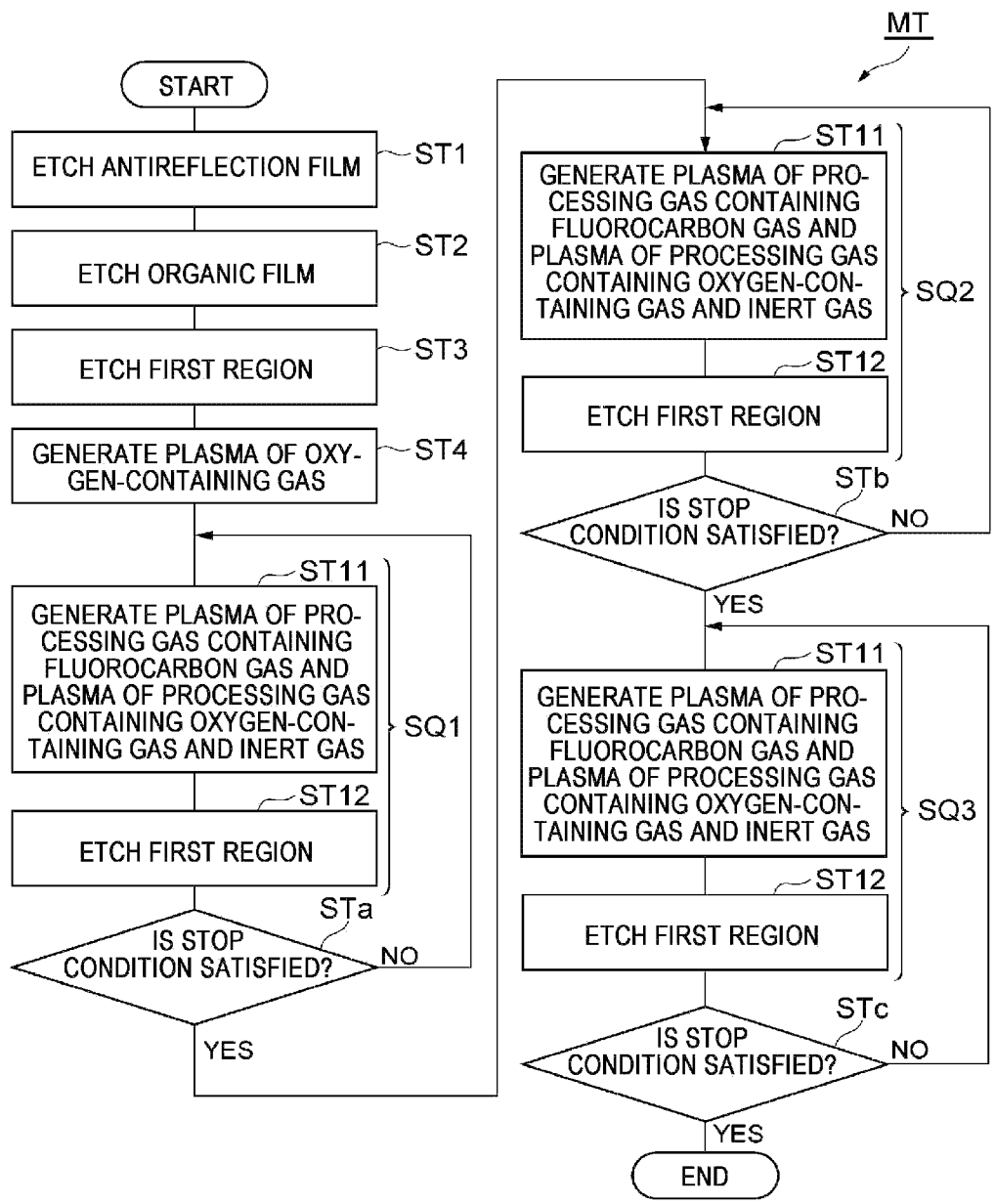
FIG. 1 is a flowchart illustrating an etching method according to an exemplary embodiment.

FIG. 1 is a flowchart illustrating an etching method according to an exemplary embodiment. Method MT illustrated in FIG. 1 is a method for selectively etching a first region made of silicon oxide with respect to a second region made of silicon nitride by a plasma processing on a workpiece.

Figure 2:
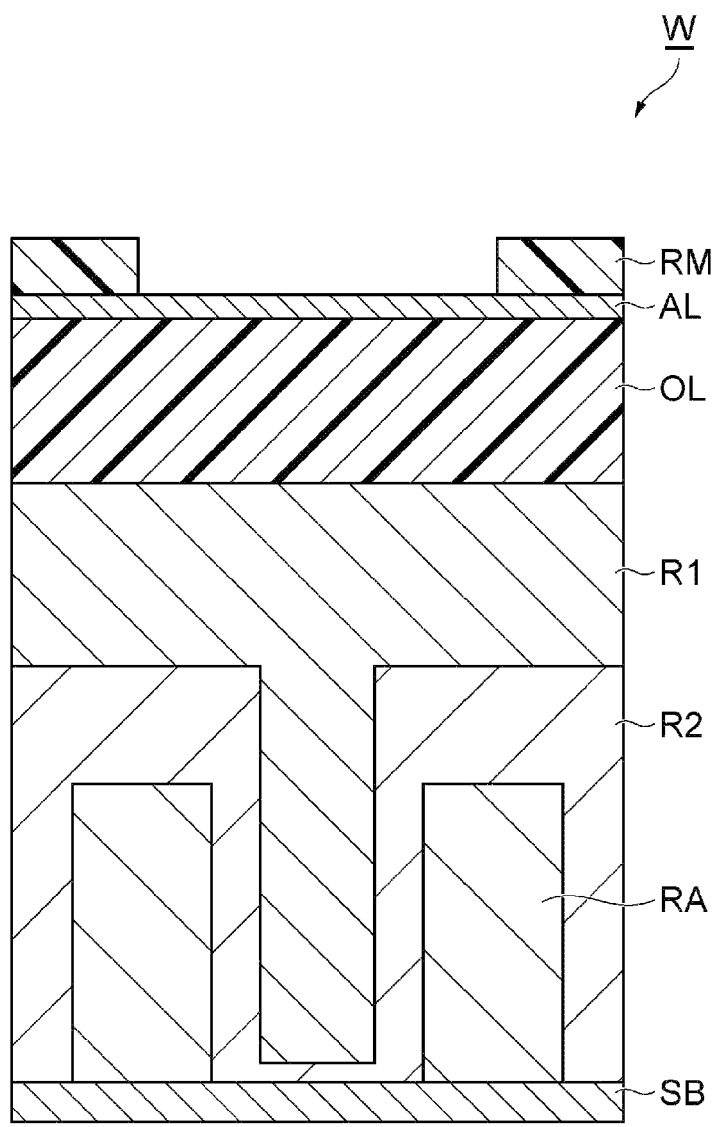
FIG. 2 is a cross-sectional view illustrating a workpiece to which the etching method according to the exemplary embodiment is applied.

FIG. 2 is a cross-sectional view illustrating a workpiece to which the etching method according to the exemplary embodiment is applied. As illustrated in FIG. 2, the workpiece (i.e., a "wafer W") includes a substrate SB, a first region R1, a second region R2, and an organic film OL, which will constitute a mask later. In an example, the wafer W is obtained in manufacturing a fin-type field effect transistor, and includes a raised area RA, a silicon-containing antireflection film AL, and a resist mask RM. In addition to the organic film, the material constituting the mask may be titanium nitride, polysilicon, or the like.

The raised area RA is provided to be raised from the substrate SB. The raised area RA may constitute, for example, a gate area. The second region R2 is made of silicon nitride ($Si_3N_4$), and provided on the surface of the raised area RA and the surface of the substrate SB. As illustrated in FIG. 2, the second region R2 extends to define a recess. In an example, the depth of the recess is about 150 nm, and the width of the recess is about 20 nm.

The first region R1 is made of silicon oxide $SiO_2$, and provided on the second region R2. Specifically, the first region R1 is provided to fill the recess defined by the second region R2, and cover the second region R2.

The organic film OL is provided on the first region R1. The antireflection film AL is provided on the organic film OL. The resist mask RM is provided on the antireflection film AL. The resist mask RM provides, over the recess defined by the second region R2, an opening having a width wider than the width of the recess. The width of the opening of the resist mask RM is, for example, 60 nm. Such a pattern of the resist mask RM is formed by a photolithography technique.

Figure 3:
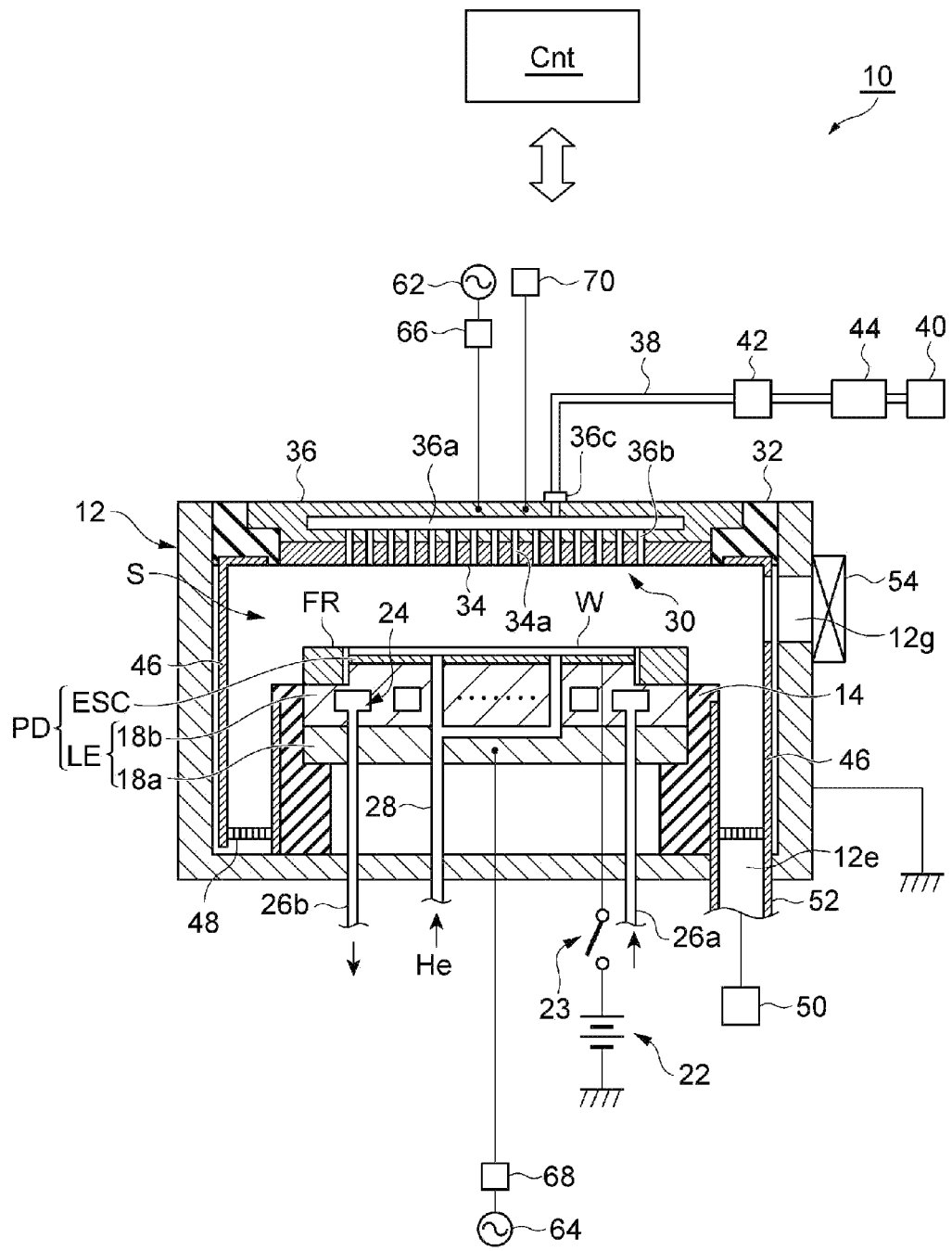
FIG. 3 is a view schematically illustrating an exemplary plasma processing apparatus that may be used for performing the method illustrated in FIG. 1.

In method MT, the workpiece such as the wafer illustrated in FIG. 2 is processed in a plasma processing apparatus. FIG. 3 is a view schematically illustrating an exemplary plasma processing apparatus that may be used for performing the method illustrated in FIG. 1. The plasma processing apparatus 10 illustrated in FIG. 3 is a capacitively coupled plasma etching apparatus, and includes a substantially cylindrical processing container 12. The inner wall surface of the processing container 12 is made of, for example, anodized aluminum. The processing container 12 is grounded for safety.

A substantially cylindrical support 14 is provided above the bottom of the processing container 12. The support 14 is made of, for example, an insulating material. The support 14 extends vertically from the bottom of the processing container 12 in the processing container 12. Further, a placing table PD is provided in the processing container 12. The placing table PD is supported by the support 14.

The placing table PD holds the wafer W on the top surface thereof. The placing table PD includes a lower electrode LE and an electrostatic chuck ESC. The lower electrode LE includes a first plate 18a and a second plate 18b. The first plate 18a and the second plate 18b are made of a metal such as, for example, aluminum, and have a substantially disc shape. The second plate 18b is provided on the first plate 18a and electrically connected to the first plate 18a.

The electrostatic chuck ESC is provided on the second plate 18b. The electrostatic chuck ESC has a structure in which an electrode made of a conductive film is disposed between a pair of insulating layers or insulating sheets. The electrode of the electrostatic chuck ESC is electrically connected with a DC power source 22 via a switch 23. The electrostatic chuck ESC attracts the wafer W through an electrostatic force such as, for example, a Coulomb force generated by a DC voltage from the DC power source 22. Therefore, the electrostatic chuck ESC is capable of holding the wafer W.

A focus ring FR is disposed on the periphery of the second plate 18b to surround the edge of the wafer W and the electrostatic chuck ESC. The focus ring FR is provided to enhance the uniformity of the etching. The focus ring FR is made of a material appropriately selected from materials of an etching target film, and may be made of, for example, quartz.

A coolant flow path 24 is provided inside the second plate 18b. The coolant flow path 24 constitutes a temperature adjustment mechanism. The coolant flow path 24 is supplied with a coolant from a chiller unit provided outside the processing container 12, through a pipe 26a. The coolant supplied to the coolant flow path 24 is returned to the chiller unit through a pipe 26b. In this manner, the coolant is circulated between the coolant flow path 24 and the chiller unit. The temperature of the wafer W supported by the electrostatic chuck ESC is controlled by controlling the temperature of the coolant.

Further, a gas supply line 28 is provided in the plasma processing apparatus 10. The gas supply line 28 supplies a heat transfer gas, for example, He gas from a heat transfer gas supply mechanism to a gap between the top surface of the electrostatic chuck ESC and the rear surface of the wafer W.

Further, the plasma processing apparatus 10 includes an upper electrode 30. The upper electrode 30 is disposed above the placing table PD to face the placing table PD. The lower electrode LE and the upper electrode 30 are provided substantially in parallel with each other. A processing space S is provided between the upper electrode 30 and the lower electrode LE to perform a plasma processing on the wafer W.

The upper electrode 30 is supported in the upper portion of the processing container 12 through an insulating shielding member 32. In an exemplary embodiment, the upper electrode 30 may be configured such that its distance in the vertical direction from the top surface of the placing table PD (i.e., the wafer placing surface) is variable. The upper electrode 30 may include an electrode plate 34 and an electrode support 36. The electrode plate 34 faces the processing space S, and a plurality of gas ejection holes 34a are provided in the electrode plate 34. In an exemplary embodiment, the electrode plate 34 is made of silicon.

The electrode support 36 is configured to detachably support the top plate 34, and may be made of a conductive material such as, for example, aluminum. The electrode support 36 may have a water-cooled structure. A gas diffusion chamber 36a is provided inside the electrode support 36. From the gas diffusion chamber 36a, a plurality of gas flowing holes 36b extend downward to be in communication with the gas ejection holes 34a, respectively. Further, the electrode support 36 includes a gas introduction port 36c configured to introduce the processing gas to the gas diffusion chamber 36a. The gas introduction port 36c is connected with a gas supply pipe 38.

The gas supply pipe 38 is connected with a gas source group 40 via a valve group 42 and a flow rate controller group 44. The gas source group 40 includes a plurality of gas sources. In an example, the gas source group 40 includes a source of one or more fluorocarbon gases, a source of a noble gas, a source of nitrogen gas ($N_2$ gas), a source of hydrogen gas ($H_2$ gas), and a source of an oxygen-containing gas. In an example, the source of one or more fluorocarbon gases may include a source of $C_4F_8$ gas, a source of $CF_4$ gas, and a source of $C_4F_6$ gas. The source of a noble gas may be a source of any noble gas such as, for example, He gas, Ne gas, Ar gas, Kr gas, or Xe gas, and in an example, a source of Ar gas. Further, the source of the oxygen-containing gas may be, for example, a source of oxygen gas ($O_2$ gas). The oxygen-containing gas may be any gas containing oxygen, or a carbon oxide gas such as, for example, CO gas or $CO_2$ gas.

The valve group 42 includes a plurality of valves, and the flow rate controller group 44 includes a plurality of flow rate controllers such as, for example, mass flow controllers. The plurality of gas sources of the gas source group 40 are connected to the gas supply pipe 38 via valves corresponding to the valve group 42 and the flow rate controllers corresponding to the flow rate controller group 44, respectively.

Further, in the plasma processing apparatus 10, a deposition shield 46 is provided detachably along the inner wall of the processing container 12. The deposit shield 46 is provided in the outer periphery of the support 14 as well. The deposit shield 46 serves to suppress any etching byproduct (deposit) from being attached to the processing container 12, and may be formed by coating an aluminum material with a ceramic (e.g., $Y_2O_3$).

An exhaust plate 48 is provided at the bottom side of the processing container 12 between the support 14 and the sidewall of the processing container 12. The exhaust plate 48 may be formed by coating an aluminum material with a ceramic (e.g., $Y_2O_3$). An exhaust port 12e is formed at the lower side of the exhaust plate 48 in the processing container 12. An exhaust port 12e is connected with an exhaust device 50 via an exhaust pipe 52. The exhaust device 50 includes a vacuum pump such as, for example, a turbo molecular pump, and is capable of decompressing the space in the processing container 12 to a desired degree of vacuum. A carry-in/out port 12g of the wafer W is formed in the side wall of the processing container 12. The carry-in/out port 12g is configured to be opened/closed by a gate valve 54.

Further, the plasma processing apparatus 10 further includes a first high frequency power source 62 and a second high frequency power source 64. The first high frequency power source 62 is a power source that generates high frequency power for plasma generation, and, for example, generates high frequency power having a frequency of 27 MHz to 100 MHz. The first high frequency power source 62 is connected to the upper electrode 30 via a matcher 66. The matcher 66 is a circuit to match the output impedance of the first high frequency power source 62 and the input impedance of the load side (the upper electrode 30 side). The first high frequency power source 62 may be connected to the lower electrode LE via the matcher 66.

The second high frequency power source 64 is a power source that generates high frequency bias power for drawing ions into the wafer W, and, for example, generates high frequency bias power having a frequency in a range of 400 kHz to 13.56 MHz. The second high frequency power source 64 is connected to the lower electrode LE via a matcher 68. The matcher 68 is a circuit to match the output impedance of the first high frequency power source 64 and the input impedance of the load side (the lower electrode LE side).

In addition, the plasma processing apparatus 10 further includes a power source 70. The power source 70 is connected to the upper electrode 30. The power source 70 applies a voltage to the upper electrode 30 to draw positive ions present in the processing space S into the electrode plate 34. In an example, the power source 70 is a DC power source that generates a negative DC voltage. In another example, the power source 70 may be an AC power source that generates an AC voltage of a relatively low frequency. The voltage applied from the power source 70 to the upper electrode may be a voltage of −150 V or less. That is, the voltage applied to the upper electrode 30 by the power source 70 may be a negative voltage of which the absolute value is 150 or more. When such a voltage is applied from the power source 70 to the upper electrode 30, positive ions present in the processing space S collide with the electrode plate 34. Accordingly, second electrons and/or silicon are released from the electrode plate 34. The released silicon is bonded to the active species of fluorine present in the processing space S, so that the amount of the active species of fluorine is reduced.

Further, in an exemplary embodiment, the plasma processing apparatus 10 may further include a controller Cnt. The controller Cnt is a computer including, for example, a processor, a storage unit, an input device, and a display device, and controls respective parts of the plasma processing apparatus 10. In the controller Cnt, an operator may execute an input operation of a command using the input device to manage the plasma processing apparatus 10, and may visualize and display the operation status of the plasma processing apparatus 10. Further, the storage unit of the controller Cnt stores a control program for controlling various processings to be performed in the plasma processing apparatus 10 by the processor, or a program for performing a processing on respective parts of the plasma processing apparatus 10 in accordance with a processing condition, that is, a processing recipe.

Referring back to FIG. 1, method MT will be described in detail. In the following descriptions, FIGS. 2 and 4 to 16 will be referred as appropriate. FIGS. 4 to 16 are cross-sectional views illustrating the workpiece in a stage during the performance of method MT. In the following, descriptions will be made on a case where the wafer W illustrated in FIG. 2 is processed using a single plasma processing apparatus 10 illustrated in FIG. 3 in method MT.

First, in method MT, the wafer W illustrated in FIG. 2 is carried into the plasma processing apparatus 10, and the wafer W is placed on the placing table PD and is held by the placing table PD.

In method MT, step ST1 is then performed. In step ST1, the antireflection film AL is etched. Therefore, in step ST1, the processing gas is supplied into the processing container 12 from a gas source selected among the plurality of gas sources of the gas source group 40. The processing gas contains a fluorocarbon gas. The fluorocarbon gas may include, for example, one or more selected from $C_4F_8$ gas and $CF_4$ gas. The processing gas may further contain a noble gas, for example, Ar gas. Further, in step ST1, the exhaust device 50 is operated, so that the pressure in the processing container 12 is set to a predetermined pressure. Further, in step ST1, the high frequency power from the first high frequency power source 62 and the high frequency bias power from the second high frequency power source 64 are supplied to the lower electrode LE.

Hereinafter, various conditions in step ST1 are exemplified.

Figure 4:
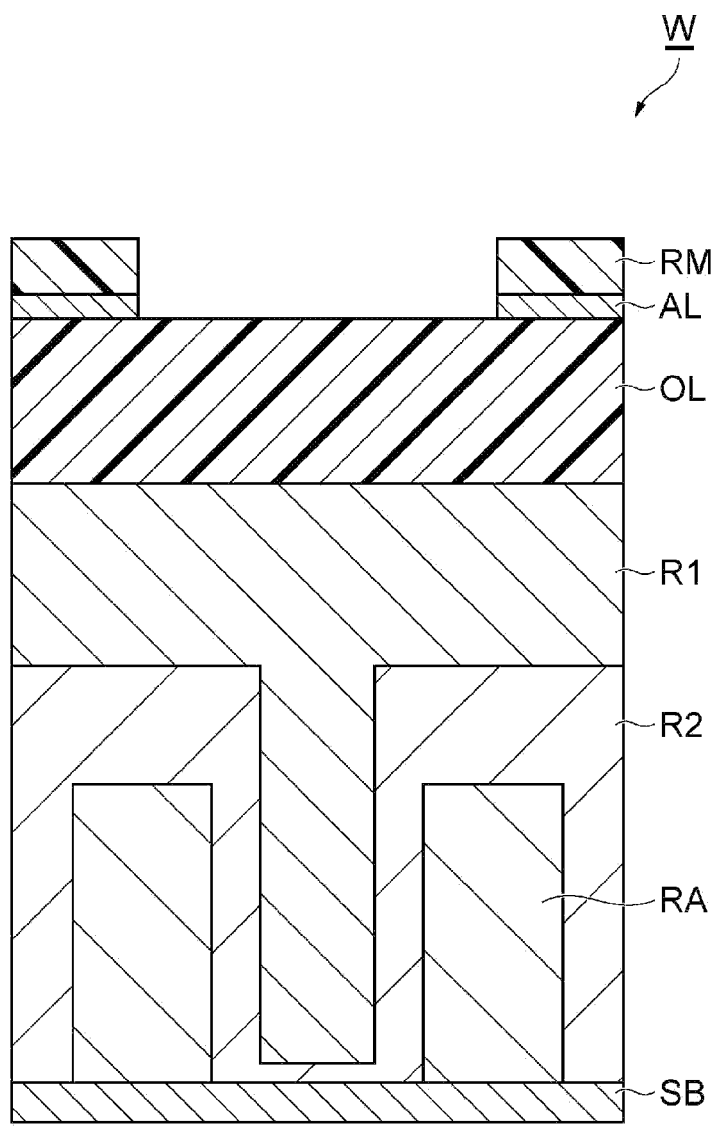
FIG. 4 is a cross-sectional view illustrating the workpiece in a stage during the performance of the method illustrated in FIG. 1.

Pressure in processing container: 10 mTorr (1.33 Pa) to 50 mTorr (6.65 Pa)
Processing gas
$C_4F_8$ gas: 30 sccm
$CF_4$ gas: 150 sccm to 300 sccm
Ar gas: 200 sccm to 500 sccm
High frequency power for plasma generation: 300 W to 1,000 W
High frequency bias power: 200 W to 500 W In step ST1, plasma of the processing gas is generated, and the antireflection film AL is etched in a portion exposed from the opening of the resist mask RM, by the active species of fluorocarbon. As a result, as illustrated in FIG. 4, in the entire region of the antireflection film AL, a portion exposed from the resist mask RM is removed. That is, the pattern of the resist mask RM is transferred to the antireflection film AL, so that a pattern providing an opening is formed in the antireflection film AL. The operation of each part of the plasma processing apparatus 10 in the step ST1 may be controlled by the controller Cnt.

In the subsequent step ST2, the organic film OL is etched. Therefore, in step ST2, the processing gas is supplied into the processing container 12 from a gas source selected among the plurality of gas sources of the gas source group 40. The processing gas may contain hydrogen gas and nitrogen gas. Further, the processing gas used in step ST2 may be a processing gas containing other gases, for example, oxygen gas, as long as it can etch the organic film. Further, in step ST2, the exhaust device 50 is operated, so that the pressure in the processing container 12 is set to a predetermined pressure. At this time, in step ST2, the high frequency power from the first high frequency power source 62 and the high frequency bias power from the second high frequency power source 64 are supplied to the lower electrode LE.

Hereinafter, various conditions in step ST2 are exemplified.

Figure 5:
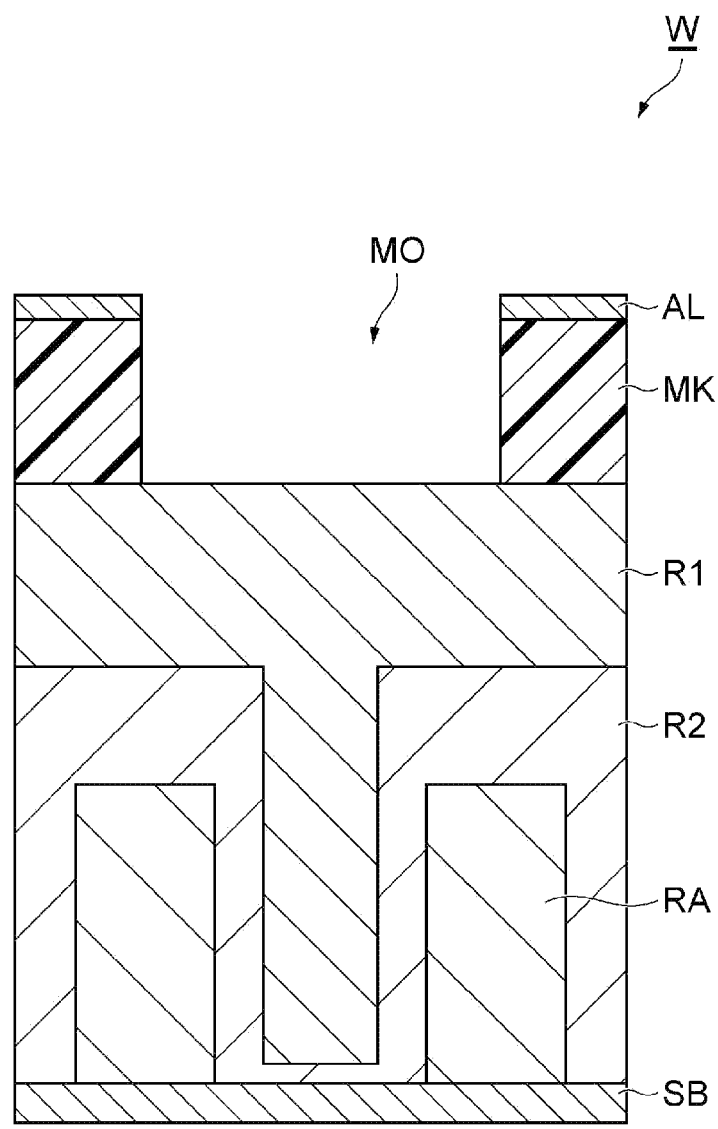
FIG. 5 is a cross-sectional view illustrating the workpiece in a stage during the performance of the method illustrated in FIG. 1.

Pressure in processing container: 50 mTorr (6.65 Pa) to 200 mTorr (26.6 Pa)
Processing gas
$N_2$ gas: 200 sccm to 400 sccm
$H_2$ gas: 200 sccm to 400 sccm
High frequency power for plasma generation: 500 W to 2,000 W
High frequency bias power: 200 W to 500 W In step ST2, plasma of the processing gas is generated, and the organic film OL is etched in a portion exposed from the opening of the antireflection film AL. Further, the resist mask RM is also etched. As a result, as illustrated in FIG. 5, the resist mask RM is removed, and in the entire region of the organic film OL, a portion exposed from the antireflection film AL is removed. That is, the pattern of the antireflection film AL is transferred to the organic film OL, and the pattern providing an opening MO is formed in the organic film OL, and a mask MK is produced from the organic film OL. The operation of each part of the plasma processing apparatus 10 in the step ST2 may be controlled by the controller Cnt.

In an exemplary embodiment, step ST3 is performed after the performance of step ST2. In step ST3, the first region R1 is etched until just before the second region R2 is exposed. That is, the first region R1 is etched until the first region R1 is slightly left on the second region R2. Therefore, in step ST3, the processing gas is supplied into the processing container 12 from a gas source selected among the plurality of gas sources of the gas source group 40. The processing gas contains a fluorocarbon gas. The processing gas may further contain a noble gas, for example, Ar gas. Further, the processing gas may further contain oxygen gas. Further, in step ST3, the exhaust device 50 is operated, so that the pressure in the processing container 12 is set to a predetermined pressure. Further, in step ST3, the high frequency power from the first high frequency power source 62 and the high frequency bias power from the second high frequency power source 64 are supplied to the lower electrode LE.

Figure 6:
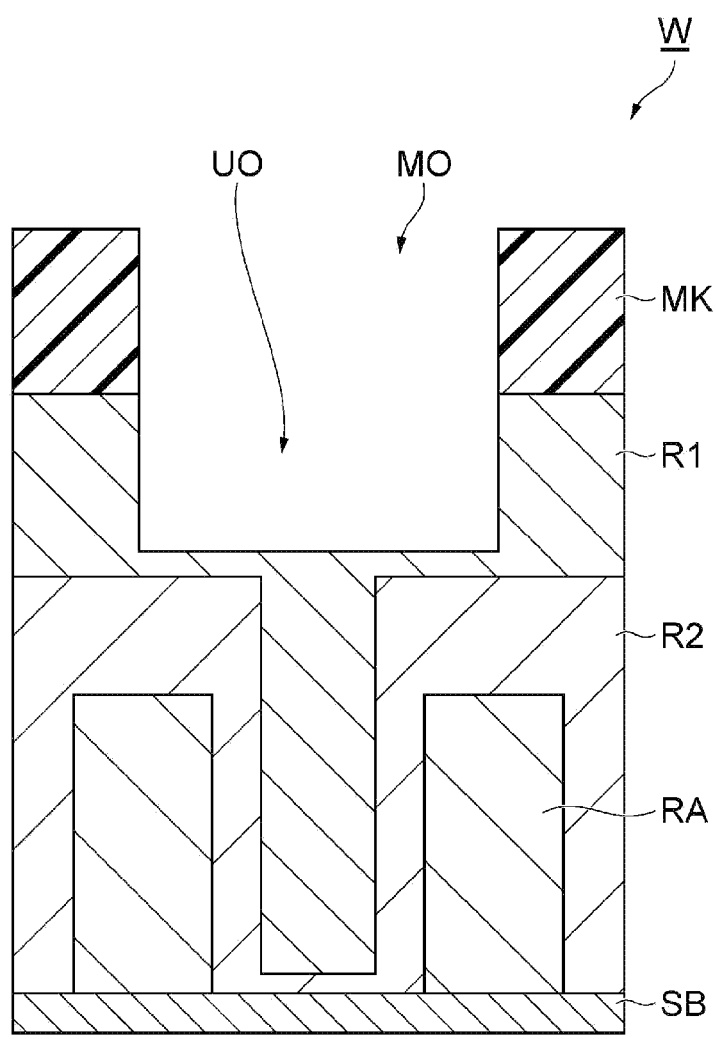
FIG. 6 is a cross-sectional view illustrating the workpiece in a stage during the performance of the method illustrated in FIG. 1.

In step ST3, plasma of the processing is generated, and the first region R1 is etched in a portion exposed from the opening of the mask MK, by the active species of fluorocarbon. The processing time of step ST3 is set such that the first region R1 is left in a predetermined thickness on the second region R2 at the time of the end of step ST3. As a result of the performance of step ST3, as illustrated in FIG. 6, an upper opening UO is partially formed. The operation of each part of the plasma processing apparatus 10 in the step ST3 may be controlled by the controller Cnt.

Here, in step ST11 (to be described later), conditions are selected for a mode in which the formation of the fluorocarbon-containing deposit on the surface of the wafer W including the first region R1 is dominant to the etching of the first region R1, that is, a deposition mode. Meanwhile, in step ST3, conditions are selected for a mode in which the etching of the first region R1 is dominant to the formation of the deposit, that is, an etching mode. Thus, in an example, the fluorocarbon gas used in step ST3 may include, for example, one or more selected from $C_4F_8$ gas and $CF_4$ gas. The fluorocarbon gas of this example is a fluorocarbon gas in which a ratio of the number of fluorine atoms to the number of carbon atoms (i.e., the number of fluorine atoms/the number of carbon atoms) is higher than a ratio of the number of fluorine atoms to the number of carbon atoms (i.e., the number of fluorine atoms/the number of carbon atoms) of the fluorocarbon gas used in step ST11. Further, in an example, in order to enhance a dissociation rate of the fluorocarbon gas, the high frequency power for plasma generation used in step ST3 may be set to be greater than the high frequency power for plasma generation used in step ST11. According to the example, it is possible to implement the etching mode. Further, in an example, the high frequency bias power used in step ST3 may also be set to be greater than the high frequency bias power of step ST11. According to the example, the energy of ions drawn into the wafer W is increased, so that the first region R1 may be etched at a high speed.

Hereinafter, various conditions in step ST3 are exemplified.

Pressure in processing container: 10 mTorr (1.33 Pa) to 50 mTorr (6.65 Pa)
Processing gas
  $C_4F_8$ gas: 10 sccm to 30 sccm
  $CF_4$ gas: 50 sccm to 150 sccm
  Ar gas: 500 sccm to 1,000 sccm
  $O_2$ gas: 10 sccm to 30 sccm
High frequency power for plasma generation: 500 W to 2,000 W
High frequency bias power: 500 W to 2,000 W In an exemplary embodiment, step ST4 is then executed. In step ST4, plasma of the processing gas containing an oxygen-containing gas is generated in the processing container 12. Therefore, in step ST4, the processing gas is supplied into the processing container 12 from a gas source selected among the plurality of gas sources of the gas source group 40. In an example, the processing gas may contain oxygen gas as the oxygen-containing gas. Further, the processing gas may further contain an inert gas such as a noble gas (e.g., Ar gas) or nitrogen gas. Further, in step ST4, the exhaust device 50 is operated, so that the pressure in the processing container 12 is set to a predetermined pressure. Further, in step ST4, the high frequency power from the first high frequency power source 62 is supplied to the lower electrode LE. Further, in step ST4, the high frequency bias power from the second high frequency power source 64 may not be supplied to the lower electrode LE.

Figure 7:
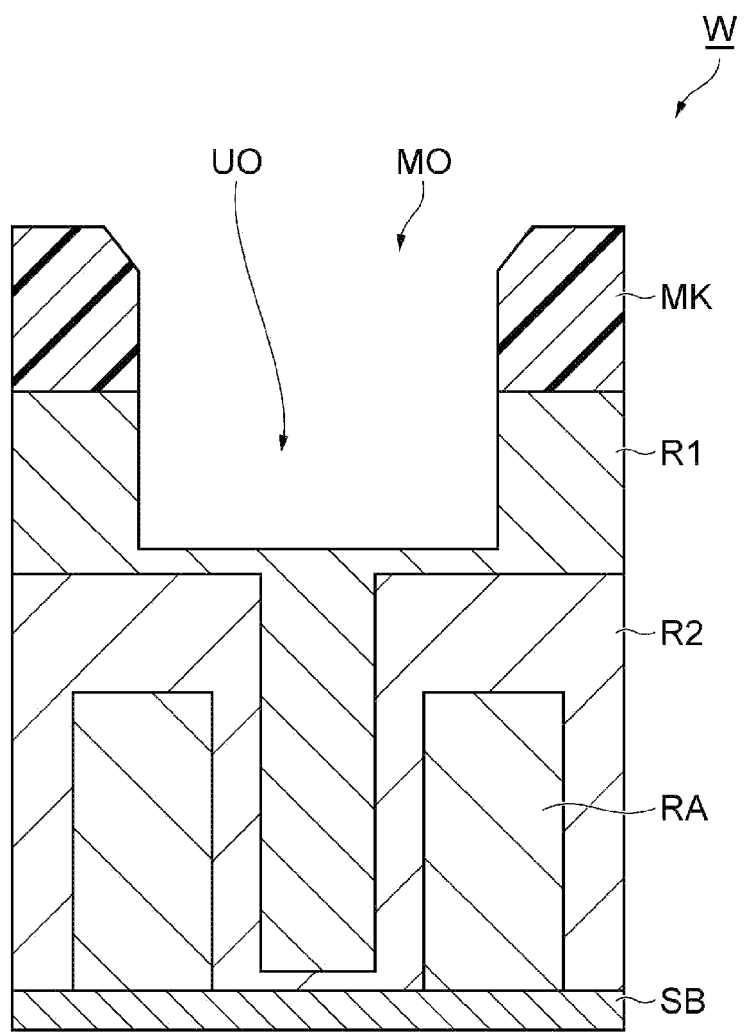
FIG. 7 is a cross-sectional view illustrating the workpiece in a stage during the performance of the method illustrated in FIG. 1.

In step ST4, active species of oxygen are generated, and the opening MO of the mask MK is widened in its upper end portion by the active species of oxygen. Specifically, as illustrated in FIG. 7, etching is performed such that the upper shoulder of the mask MK defining the upper end portion of the opening is tapered. Thus, even though a deposit produced in subsequent steps is attached to the surface defining the opening MO of the mask MK, the amount of reduction in width of the opening MO may be reduced. The operation of each part of the plasma processing apparatus 10 in the step ST4 may be controlled by the controller Cnt.

Here, step ST11 (to be described later) is a step of reducing a trace amount of the deposit formed in each sequence, and it is necessary to suppress excessive reduction of the deposit. Meanwhile, step ST4 is performed to widen the width of the upper end portion of the opening MO of the mask MK, and a short processing time is required.

Hereinafter, various conditions in step ST4 are exemplified.

Pressure in processing container: 30 mTorr (3.99 Pa) to 200 mTorr (26.6 Pa)
Processing gas
  $O_2$ gas: 15 sccm to 500 sccm
  Ar gas: 200 sccm to 1,500 sccm
High frequency power for plasma generation: 100 W to 500 W
High frequency bias power: 0 W to 200 W Subsequently, in method MT, one or more sequences SQ1 are executed, and then, one or more sequences SQ2 are executed. Further, in an exemplary embodiment, one or more sequences SQ3 may be executed as necessary after the execution of one or more sequences SQ2. The sequence SQ1, sequence SQ2, and sequence SQ3 are executed to etch the first region R1. Each of the sequence SQ1, the sequence SQ2, and the sequence SQ3 includes step ST11 and step ST12. Hereinafter, details of step ST1 and step ST2 common to all of the sequence SQ1, the sequence SQ2, and the sequence SQ3 will be described, and the difference between the sequence SQ1, the sequence SQ2, and the sequence SQ3 will be described below.

In each sequence, step ST11 is first executed. In step ST11, plasma of a processing gas containing a fluorocarbon gas and plasma of a processing gas containing an oxygen-containing gas and an inert gas are generated in the processing container 12 in which the wafer W is accommodated. Therefore, in step ST11, the processing gas is supplied into the processing container 12 from a gas source selected among the plurality of gas sources of the gas source group 40. The processing gas contains a fluorocarbon gas, an oxygen-containing gas, and an inert gas. In step ST11, conditions for setting the deposition mode are selected as described above. Thus, in an example, $C_4F_6$ gas is used as the fluorocarbon gas. The oxygen-containing gas includes, for example, oxygen gas, and the inert gas includes a noble gas such as Ar gas. The inert gas may be nitrogen gas. Further, in step ST11, the exhaust device 50 is operated, so that the pressure in the processing container 12 is set to a predetermined pressure. Further, in step ST11, the high frequency power from the first high frequency power source 62 is supplied to the lower electrode LE.

Figure 8:
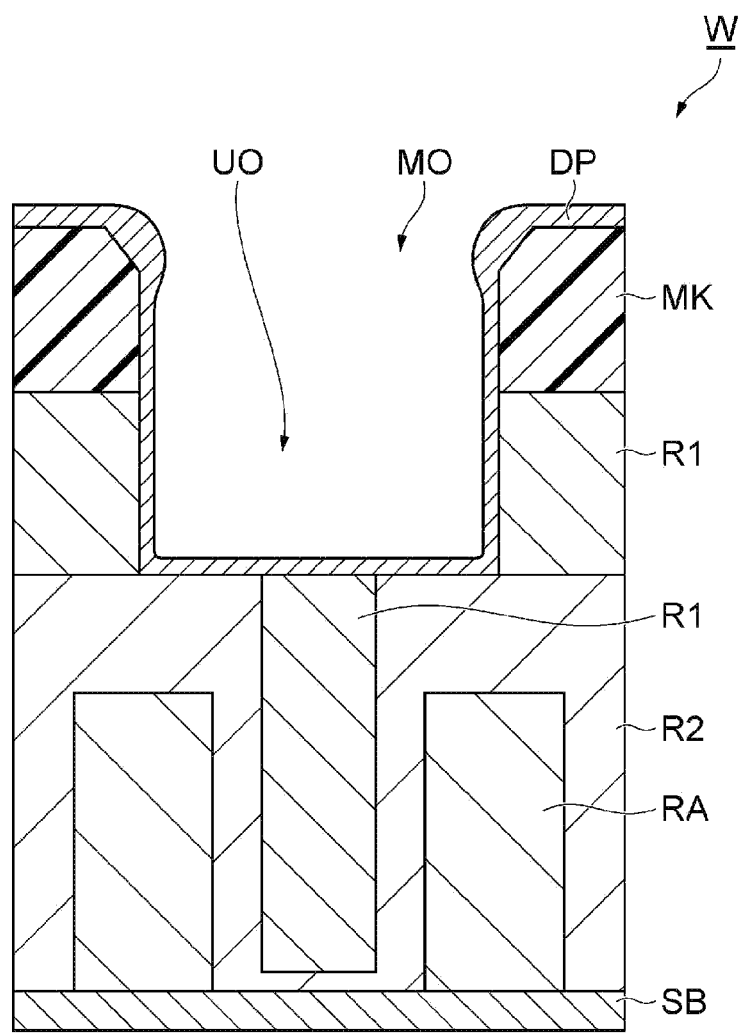
FIG. 8 is a cross-sectional view illustrating the workpiece in a stage during the performance of the method illustrated in FIG. 1.
Figure 11:
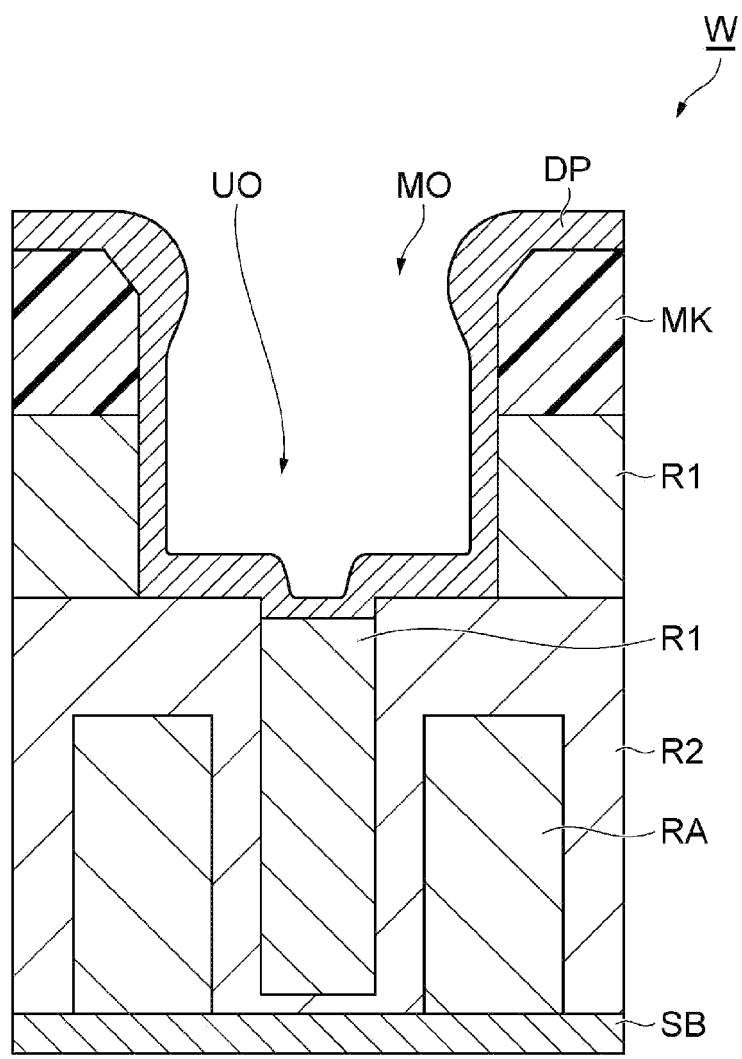
FIG. 11 is a cross-sectional view illustrating the workpiece in a stage during the performance of the method illustrated in FIG. 1.
Figure 14:
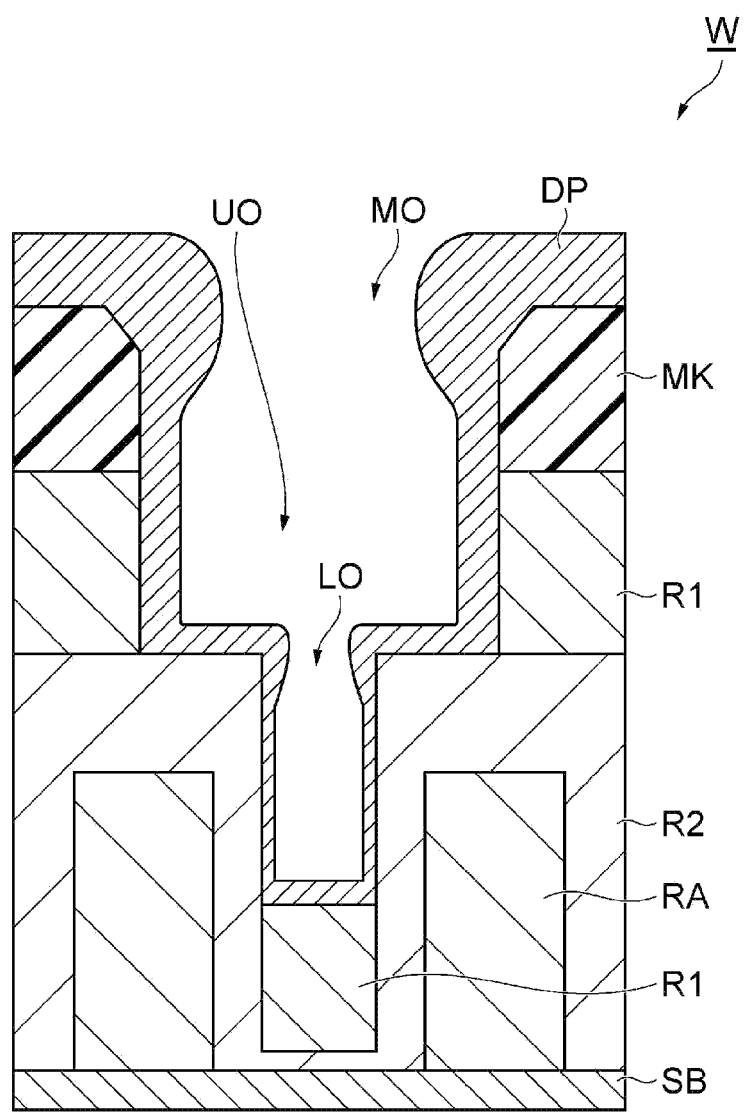
FIG. 14 is a cross-sectional view illustrating the workpiece in a stage during the performance of the method illustrated in FIG. 1.

In step ST11, plasma of the processing gas containing the fluorocarbon gas or the processing gas containing the fluorocarbon gas and the inert gas is generated, so that dissociated fluorocarbon is deposited on the surface of the wafer W to form a deposit DP (see FIGS. 8, 11, and 14). The operation of each part of the plasma processing apparatus 10 in the step ST11 may be controlled by the controller Cnt.

Figure 9:
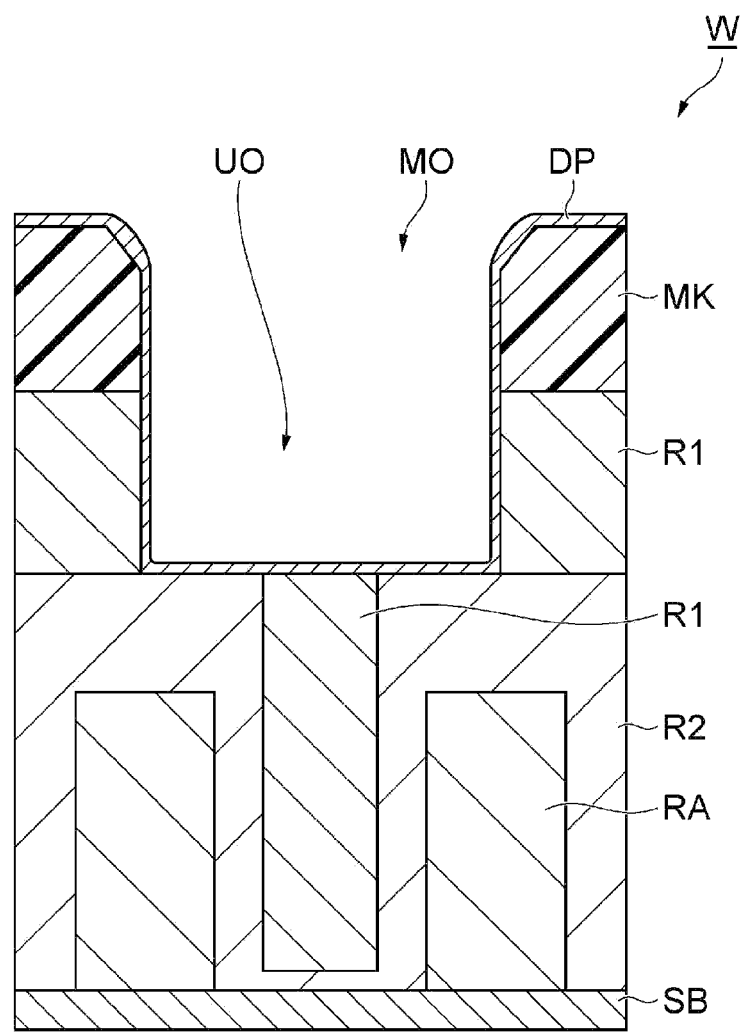
FIG. 9 is a cross-sectional view illustrating the workpiece in a stage during the performance of the method illustrated in FIG. 1.
Figure 12:
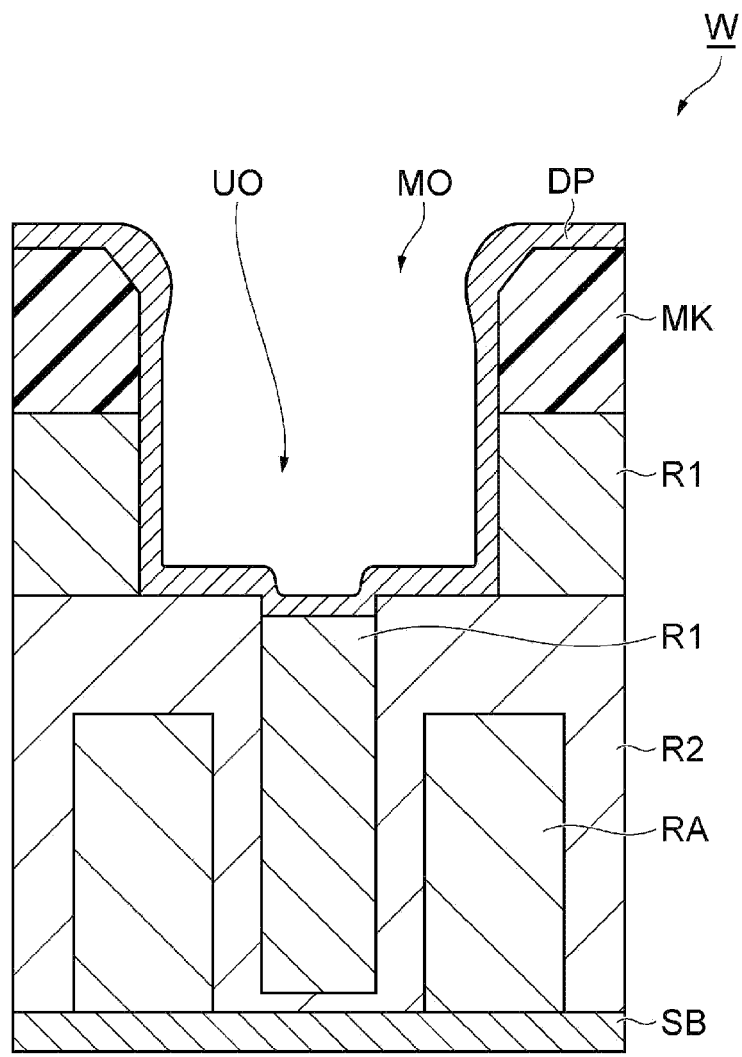
FIG. 12 is a cross-sectional view illustrating the workpiece in a stage during the performance of the method illustrated in FIG. 1.
Figure 15:
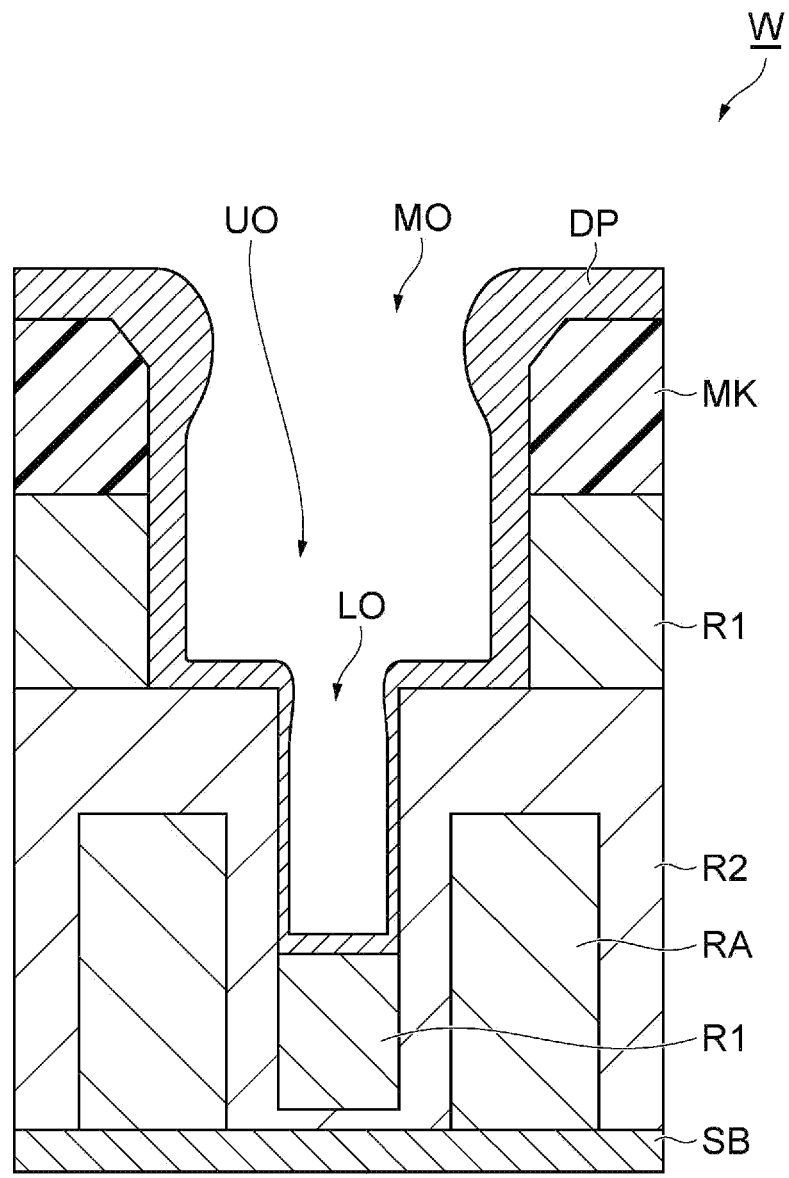
FIG. 15 is a cross-sectional view illustrating the workpiece in a stage during the performance of the method illustrated in FIG. 1.

In step ST11, active species of oxygen is generated over a period in which the deposit DP is formed by the fluorocarbon, and the amount of the deposit DP on the wafer W is moderately reduced by the active species of the oxygen (see FIGS. 9, 12, and 15). These states illustrated in FIGS. 8 and 9 occur simultaneously in step ST11. As a result, blockage of the opening MO and the upper opening UO by excessive deposit DP is suppressed. Further, in the processing gas used in step ST11, since the oxygen gas is diluted by the inert gas, the deposit DP is suppressed from being excessively removed. The operation of each part of the plasma processing apparatus 10 in the step ST11 may be controlled by the controller Cnt.

Hereinafter, various conditions in step ST11 are exemplified.

Pressure in processing container: 10 mTorr (1.33 Pa) to 50 mTorr (6.65 Pa)
Processing gas
$C_4F_6$ gas flow rate: 1 sccm to 20 sccm
Ar gas flow rate: 200 sccm to 1,500 sccm
$O_2$ gas flow rate: 1 sccm to 20 sccm
High frequency power of first high frequency power source 62: 40 MHz, 50 W to 500 W
High frequency bias power of second high frequency power source 64: 13 MHz, 0 W to 50 W.
DC voltage of power source 70: 0 V to −500 V In an exemplary embodiment, step ST11 of each sequence, that is, one step ST11 is executed for 2 seconds or more, for example, 2.5 seconds to 3 seconds. The deposition time in step ST11 may be set to 3 seconds in the first sequence SQ1 and a shorter time in the second sequence SQ2, for example, 2.5 seconds. Therefore, it is possible to appropriately control the increase in the film thickness of the protective film on the silicon nitride, thereby obtaining the effect of improving the releasability. When the etching rate of the deposit DP is too high during such a period of time, the deposit for protecting the second region R2 may be excessively removed. Thus, in step ST11, the deposit DP is etched at a rate of 1 nm/sec or less. Accordingly, it is possible to appropriately adjust the amount of the deposit DP formed on the wafer W. The rate of 1 nm/sec or less for the etching of the deposit DP in step ST11 may be achieved by selecting the pressure in the processing container, a degree of dilution of the oxygen in the processing gas with the noble gas, that is, the oxygen concentration, and the high frequency power for plasma generation within the conditions described above. In the case where the fluorocarbon gas, the inert gas, and the oxygen gas are supplied within the overlapping period (the same period) in the step ST11, it is unnecessary to take into consideration the stabilization time accompanying the switching of the gas and the discharge stabilization time, compared with the case where the fluorocarbon gas and the oxygen gas are supplied in different periods. That is, it is not necessary to consider the stabilization time accompanying the switching of the processing gas and the discharge stabilization time. Further, the molar ratio of the fluorocarbon gas to the oxygen gas in the deposition step may be about 1:0.5 to about 1:1.5. In this case, it is possible to obtain effects such as improvement of microloading and improvement of releasability. Further, in the case of forming the opening shape using the deposit, the planar shape may be circular, rectangular, slit, or long-hole shape. Further, it has been confirmed that the formed opening may be patterned as designed without greatly distorting it.

In each sequence, step ST12 is then executed. In step ST12, the first region R1 is etched. Therefore, in step ST12, the processing gas is supplied into the processing container 12 from a gas source selected among the plurality of gas sources of the gas source group 40. The processing gas contains an inert gas. In an example, the inert gas may be a noble gas such as Ar gas. Alternatively, the inert gas may be nitrogen gas. The etching of step ST12 is performed with a substantially oxygen-free processing gas. By "substantially oxygen-free" is meant that oxygen is not intentionally introduced into the processing gas. Further, in step ST12, the exhaust device 50 is operated, so that the pressure in the processing container 12 is set to a predetermined pressure. Furthermore, in step ST12, the high frequency power from the first high frequency power source 62 is supplied to the lower electrode LE. Further, in step ST12, the high frequency bias power from the first high frequency power source 64 is supplied to the lower electrode LE.

Hereinafter, various conditions in step ST12 are exemplified.

Pressure in processing container: 10 mTorr (1.33 Pa) to 50 mTorr (6.65 Pa)
Processing gas
Ar gas: 200 sccm to 1,500 sccm
High frequency power of first high frequency power source 62: 40 MHz, 50 W to 500 W
High frequency bias power of second high frequency power source 64: 13 MHz, 0 W to 50 W
DC voltage of power source 70: 0 V to −500 V In step ST12, plasma of the inert gas is generated, and ions are drawn to the wafer W. Then, the first region R1 is etched by radicals of the fluorocarbon contained in the deposit DP (see FIGS. 10, 13, and 16). The operation of each part of the plasma processing apparatus 10 in the step ST12 may be controlled by the controller Cnt.

Figure 10:
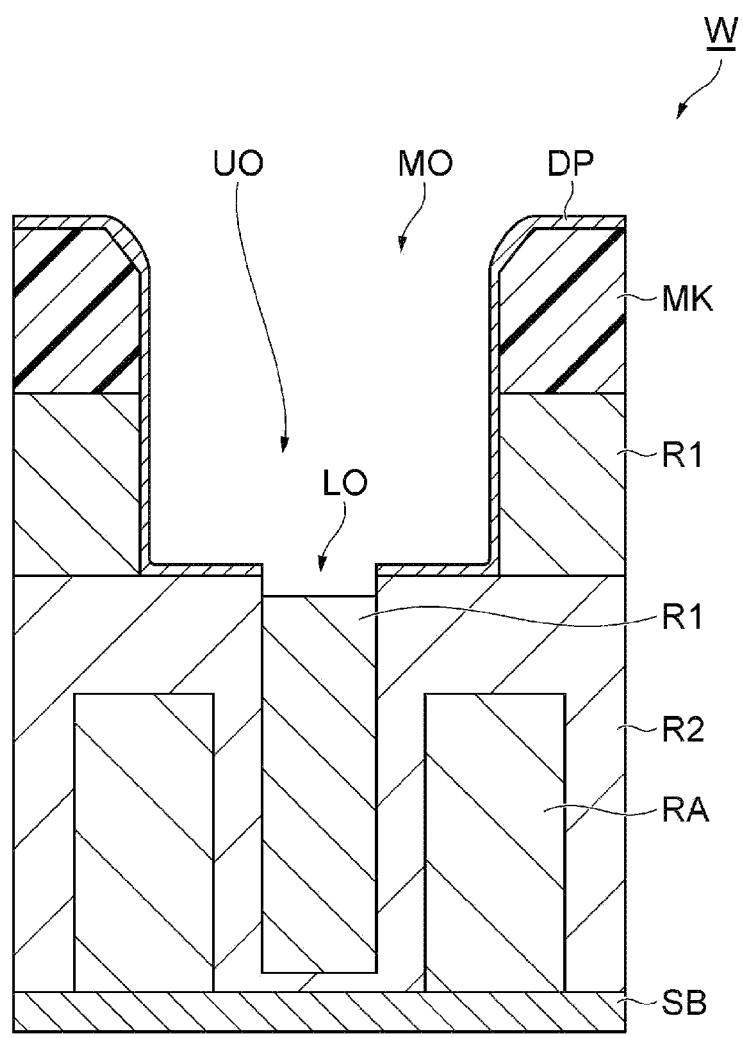
FIG. 10 is a cross-sectional view illustrating the workpiece in a stage during the performance of the method illustrated in FIG. 1.

In method MT, the sequence SQ1 is executed in a period including the time when the second region R2 is exposed. In step ST11 of the sequence SQ1, a deposit DP is formed on the wafer W as illustrated in FIG. 8. FIG. 8 illustrates a state where etching of the first region R1 proceeds, the second region R2 is exposed, and the deposit DP is formed on the second region R2. The deposit DP protects the second region R2. Then, in step ST11 of the sequence SQ1, as illustrated in FIG. 9, the amount of the deposit DP formed in the same step ST11 is reduced. Then, in step ST12 of the sequence SQ1, the first region R1 is etched by radicals of the fluorocarbon contained in the deposit DR With this sequence SQ1, the second region R2 is exposed, and the first region R1 in the recess provided by the second region R2 is etched while the second region R2 is protected by the deposit DP. As a result, as illustrated in FIG. 10, a lower opening LO is gradually formed.

The sequence SQ1 is repeated once or more. In an example, the sequence SQ1 is repeated 30 times. Therefore, as illustrated in FIG. 1, after execution of step ST12, it is determined whether s stop condition is satisfied in step STa. The stop condition is determined to be satisfied when the sequence SQ1 is executed a predetermined number of times. In step STa, when it is determined that the stop condition is not satisfied, the sequence SQ1 is executed from step ST11. Meanwhile, when it is determined that the stop condition is satisfied in step STa, a sequence SQ2 is subsequently executed. Further, the high frequency bias power of the second high frequency power source 64 is lowered to 50 W in the first sequence SQ1, and to 20 W in the second sequence. The etching time in the first sequence SQ1 is set to 5 seconds, and the etching time in the second sequence SQ2 set to a longer time, for example, 10 seconds. Therefore, the effect of suppressing wear of silicon nitride may be obtained in a state where the releasability is maintained.

Figure 13:
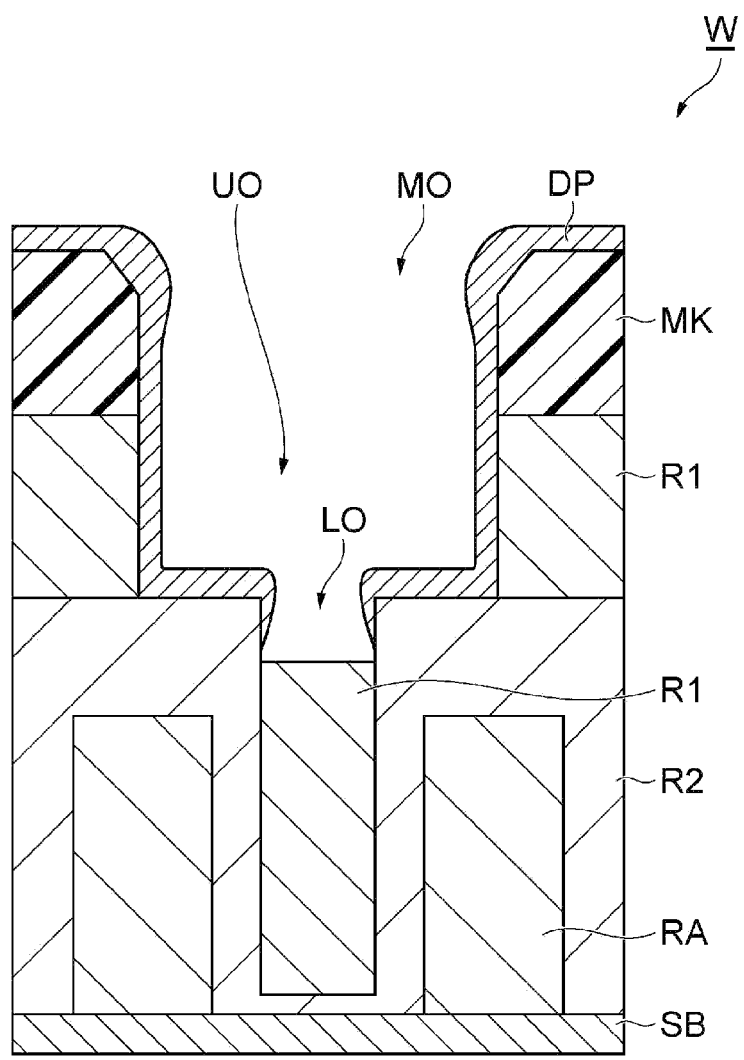
FIG. 13 is a cross-sectional view illustrating the workpiece in a stage during the performance of the method illustrated in FIG. 1.

In step ST11 of the sequence SQ2, a deposit DP is formed on the wafer W as illustrated in FIG. 11. Then, in step ST11 of the sequence SQ1, as illustrated in FIG. 12, the amount of the deposit DP formed in the same step ST11 is further reduced. Then, in step ST12 of the sequence SQ2, the first region R1 is etched by radicals of the fluorocarbon contained in the deposit DP. With this sequence SQ1, the first region R1 in the recess provided by the second region R2 is further etched while the second region R2 is protected by the deposit DP. As a result, as illustrated in FIG. 13, the depth of the lower opening LO is increased.

In an exemplary embodiment, since the method includes the second step of selectively etching the first region made of silicon oxide by radicals of fluorocarbon, the first region is etched, and the second region made of silicon nitride is suppressed from being worn. Further, in step ST11, the deposit DP is formed by the processing gas containing the fluorocarbon gas, or the plasma of the processing gas containing the fluorocarbon gas and the inert gas. Along with this, in the same step, the amount of the deposit DP on the wafer W is appropriately reduced by the active species of oxygen. Formation of the deposit DP and moderate reduction of the amount of the deposit DP are carried out in the first step, and it is not necessary to switch the processing gas. Thus, it is not necessary to consider the discharge stabilization time accompanying the switching of the processing gas.

Further, in an exemplary embodiment of the method, the etching of the second step is performed with a substantially oxygen-free processing gas. In this method, the selective etching of the first region with respect to the second region is efficiently performed.

The sequence SQ1 is repeated once or more. In an example, the sequence SQ1 is repeated 40 times. Therefore, as illustrated in FIG. 1, after execution of step ST12, it is determined whether s stop condition is satisfied in step STb. The stop condition is determined when the sequence SQ2 is performed a predetermined number of times. In step STb, when it is determined that the stop condition is not satisfied, the sequence SQ2 is performed from step ST11. Meanwhile, when it is determined that the stop condition is satisfied in step STb, the execution of the sequence SQ2 is subsequently terminated.

In method MT, the processing condition of the sequence SQ1 is set such that the amount by which the first region R1 is etched in each sequence SQ1 is smaller than the amount by which the first region R1 is etched in each sequence SQ2. In an example, the execution time length of each sequence SQ1 is set to be shorter than the execution time length of each sequence SQ2. In this example, the ratio of the execution time length of step ST11 and the execution time length of step ST12 in the sequence SQ1 may be set similarly to the ratio of the execution time length of step ST11 and the execution time length of step ST13 in the sequence SQ2. For example, in the sequence SQ1, the execution time length of step ST11 is selected in a range of 2 seconds to 5 seconds, and the execution time length of step ST12 is selected in a range of 5 seconds to 10 seconds. Further, in the sequence SQ2, the execution time length of step ST11 is selected in a range of 2 seconds to 10 seconds, and the execution time length of step ST12 is selected in a range of 5 seconds to 20 seconds.

The active species of the fluorocarbon produced in step ST11 is deposited on the second region R2 and protects the second region R2. However, when the first region R1 is etched so that the second region R2 is exposed, the active species may etch the second region R2. Therefore, in method MT, the sequence SQ1 is executed once or more during the period in which the second region R2 is exposed. Accordingly, the deposit DP is formed on the wafer W while the etching amount is suppressed, and the second region R2 is protected by the deposit DP. Thereafter, the sequence SQ2 having a large etching amount is executed once or more. Thus, according to method MT, it is possible to etch the first region R1 while suppressing wear of the second region R2.

Further, since the deposit DP has already been formed on the second region R2 in the sequence SQ1, the wear of the second region R2 may be suppressed even when the etching amount in each sequence SQ2 is increased. As described above, by increasing the etching amount of each sequence SQ2 more than the etching amount of each sequence SQ1, the etching rate of the first region R1 in method MT may be improved.

Figure 16:
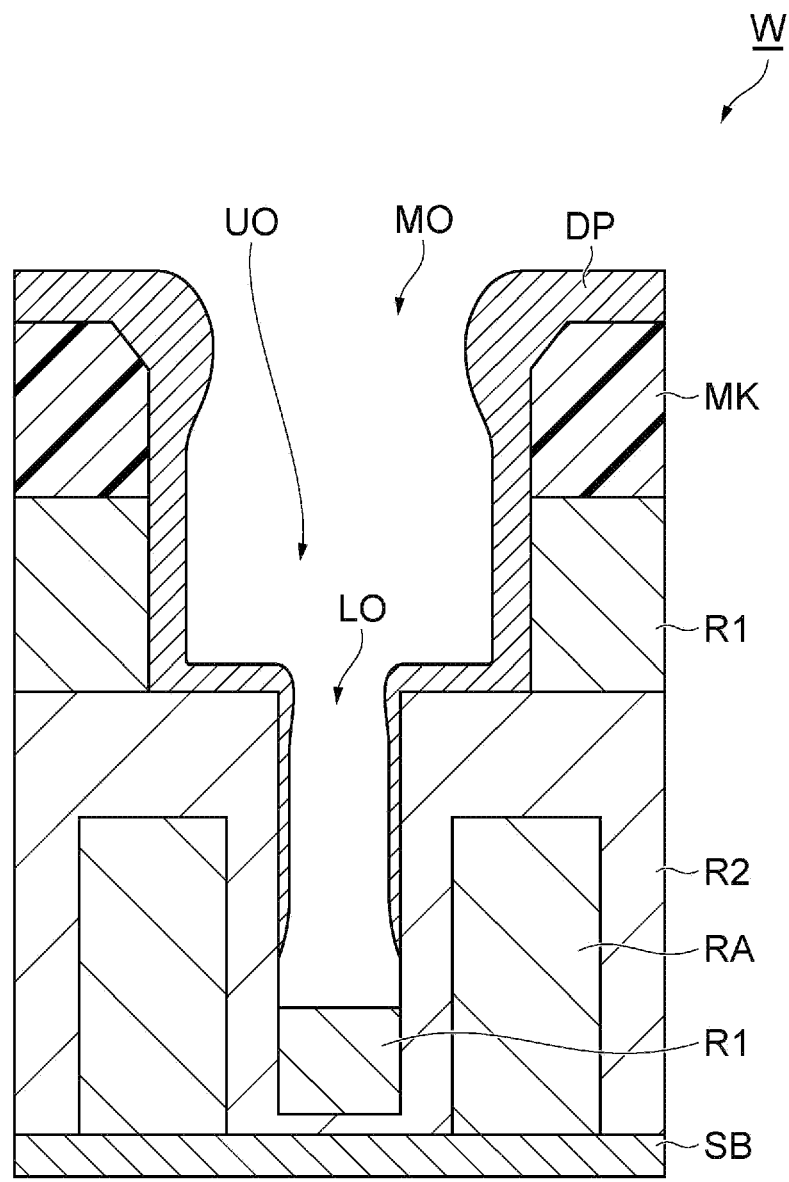
FIG. 16 is a cross-sectional view illustrating the workpiece in a stage during the performance of the method illustrated in FIG. 1.

In method MT of an exemplary embodiment, after the execution of sequence SQ2, a sequence SQ3 may be further executed as necessary. In step ST11 of the sequence SQ3, a deposit DP is formed on the wafer W as illustrated in FIG. 14. Then, in step ST11 of the sequence SQ3, as illustrated in FIG. 15, the amount of the deposit DP formed in the same step ST11 is reduced. Then, in step ST12 of the sequence SQ3, the first region R1 is etched by radicals of the fluorocarbon contained in the deposit DP. With this sequence SQ3, the first region R1 in the recess provided by the second region R2 is further etched while the second region R2 is protected by the deposit DR As a result, as illustrated in FIG. 16, the depth of the lower opening LO is further increased, and finally, as illustrated in FIG. 16, the first region R1 is etched until the second region R2 present on the bottom of the recess is exposed.

The sequence SQ3 is repeated once or more. Therefore, as illustrated in FIG. 1, after execution of step ST12, it is determined whether s stop condition is satisfied in step STc. The stop condition is determined to be satisfied when the sequence SQ3 is executed a predetermined number of times. In step STc, when it is determined that the stop condition is not satisfied, the sequence SQ3 is executed from step ST11. Meanwhile, in step STc, when it is determined that the stop condition is satisfied, the performance of method MT is ended.

In step ST12 of the sequence SQ3, the high-frequency bias power is set to be greater than the high-frequency bias power used in step ST12 of the sequence SQ1 and the sequence SQ2. For example, in step ST12 of the sequence SQ1 and the sequence SQ2, the high frequency bias power is set to 20 W to 100 W, and in step ST12 of the sequence SQ3, the high frequency bias power is set to 100 W to 300 W. Further, in the sequence SQ2 in an example, the execution time length of step ST11 is selected in a range of 3 seconds to 10 seconds, and the execution time length of step ST12 is selected in a range of 5 seconds to 15 seconds.

As illustrated in FIG. 14, after execution of the sequence SQ1 and the sequence SQ2, the amount of the deposit DP on the wafer W considerably increases. When the amount of the deposit DP increases, the width of the opening MO, the width of the upper opening UO, and the width of the lower opening LO are narrowed by the deposit DP. As a result, there is a possibility that the flux of ions reaching the deep portion of the lower opening LO becomes insufficient. However, since the high frequency bias used in step ST13 of the sequence SQ3 is relatively high, the energy of ions drawn into the wafer W is increased. As a result, even though the lower opening LO is deep, it is possible to supply ions to the deep portion of the lower opening LO.

Figure 17A:
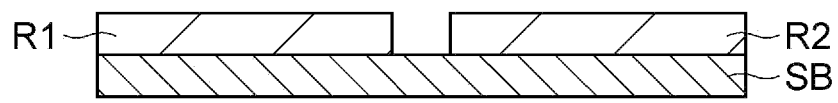
FIGS. 17A to 17C are cross-sectional views illustrating the first region and the second region of the workpiece according to the exemplary embodiment.
Figure 17B:
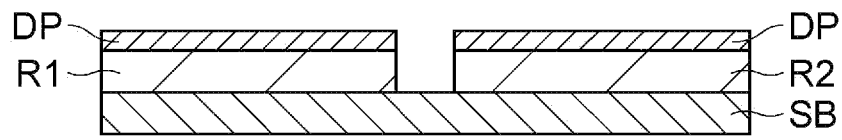
Figure 17C:
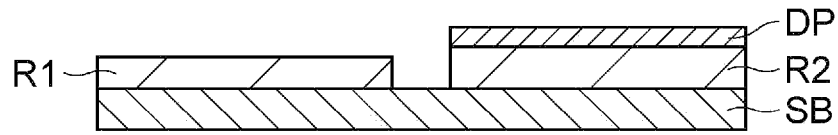

FIGS. 17A to 17C are cross-sectional views illustrating a first region and a second region of a workpiece according to an exemplary embodiment, and FIGS. 17A to 17C illustrate a technique of selectively etching the first region with respect to the second region. FIG. 17A illustrates a wafer W1 on which a first region R1 and a second region R2 are formed on a substrate SB. FIG. 17B illustrates a cross-sectional view of the wafer W1 after step ST11 is executed, and FIG. 17C illustrates a cross-sectional view of the wafer W1 after step ST12 is executed. The first region R1 is made of silicon oxide ($SiO_2$), and the second region R2 is made of silicon nitride ($Si_3N_4$). Various conditions such as pressures inside the processing container in step ST11 and step ST12 may be the same as the conditions described above.

As illustrated in FIG. 17B, when the step ST11 is executed on the wafer W1, a deposit DP is formed on the first region R1 and the second region R2 by plasma of a processing gas containing a fluorocarbon gas and oxygen gas. In an example, $C_4F_6$ gas is used as the fluorocarbon gas. A noble gas such as Ar gas may be contained in the processing gas of step ST11. In step ST11, since active species of oxygen are additionally contained in the processing gas, the amount of the deposit DP on the wafer W is appropriately reduced by the active species of the oxygen.

As illustrated in FIG. 17C, when step ST12 is executed on the wafer W1, the wafer W after the processing of step ST11 is exposed to plasma of the noble gas, The noble gas includes, for example, Ar. After the processing of step ST12, the first region R1 is etched by radicals of the fluorocarbon contained in the deposit DP.

In step ST12, active species of the noble gas atoms, for example, ions of Ar gas atoms collide with the deposit DP. Therefore, as illustrated in FIG. 17C, the fluorocarbon radicals in the deposit DP advance the etching of the first region R1 and reduce the thickness of the first region R1. Further, in the first region R1, the film thickness of the deposit DP decreases. Meanwhile, in the second region R2, the film thickness of the deposit DP decreases, but the etching of the second region R2 is suppressed. Thus, the amount of decrease in the thickness of the second region R2 is significantly smaller than the amount of decrease in the thickness of the first region R1.

DESCRIPTION OF SYMBOLS

10: plasma processing apparatus, 12: processing container, 30: upper electrode, PD: placing table, LE: lower electrode, ESC: electrostatic chuck, 40: gas source group, 42: valve group, 44: flow rate controller group, 50: exhaust device, 62: first high frequency power source, 64: second high frequency power source, Cnt: controller, W: wafer, W1: wafer, R1: first region, R2: second region, OL: organic film, AL: silicon-containing antireflection film, MK: mask, DP: deposit

The invention claimed is:

1. A substrate processing apparatus comprising:
   at least one processing container;
   a substrate support inside the processing container which supports a substrate during processing;
   a port through which the substrate is transferred into the processing container;
   a first power supply which supplies a plasma generating power to the processing container at a first frequency;
   a second power supply which supplies a biasing power to the substrate support at a second frequency which is different from the first frequency;
   a gas supply configured to selectively supply a plurality of gases including a fluorocarbon gas, an oxygen gas, a hydrogen gas, and at least one of an inert gas or a noble gas;
   an exhaust device which includes a vacuum pump; and
   a controller;
   wherein the apparatus is configured to form a fluorocarbon deposit on the substrate, and after forming the fluorocarbon deposit, to perform an etching using fluorocarbon radicals of the deposit to etch the substrate at a location below the fluorocarbon deposit,
   wherein the controller is configured to:
   (a) receive the substrate on the substrate support, the substrate having a first region and a second region, the second region including a recess, the first region filling the recess and also extending over and covering the second region, the substrate further including a mask above the first region, the mask having an opening width larger than an opening width of the recess;
   (b) perform a first etching through the mask in an upper portion of the first region to remove part of the upper portion of the first region and form an opening in the upper part of the first region at a location above the second region and stop the first etching prior to exposing the second region;
   (c) after the first etching, perform a selective etch of the first region such that, during the selective etch, a portion of the first region in the recess is etched, the selective etch including:
   (i) performing a first step using the fluorocarbon gas from the gas supply to form the fluorocarbon deposit on the substrate by supplying the fluorocarbon gas and an oxygen gas during the first step during the first step and by suppling at least one of an inert gas and a noble gas during the first step;
   (ii) after the first step, performing a second step of etching the first region in the recess in which the fluorocarbon radicals from the fluorocarbon deposit etch the first region in the recess to remove portions of the first region from the recess and stopping supply of the fluorocarbon gas and the oxygen gas during the second step while continuing to supply the at least one of an inert gas and a noble gas.

2. The substrate processing apparatus according to claim 1, further including a third power supply, wherein the third power supply is a DC power supply.

3. The substrate processing apparatus according to claim 1, wherein the controller is configured to control the forming of the fluorocarbon deposit and the etching such that the fluorocarbon deposit is formed on a side wall of a feature of the substrate during forming of the deposit, and during the etching, radicals from the fluorocarbon deposit on the side wall etch a bottom of the feature.

4. The substrate processing apparatus according to claim 1, wherein the controller is configured to stop the first etching before the second region is exposed, and
   wherein during the selective etch, a portion of the fluorocarbon deposit is formed on a side wall of the first region and on the second region.

5. A substrate processing apparatus comprising:
   at least one processing container, a substrate support inside the processing container;

a power supply;
a gas supply; and
a controller configured to control the apparatus to:
(a) receive a substrate on the substrate support, the substrate having a first region and a second region, the second region including a recess, the first region filling the recess and also extending over and covering the second region, the substrate further including a mask above the first region, the mask having an opening width larger than an opening width of the recess;
(b) perform a first etching through the mask in an upper portion of the first region to remove part of the upper portion of the first region and form an opening in the upper part of the first region at a location above the second region and stop the first etching prior to exposing the second region;
(c) after the first etching, perform a selective etch of the first region such that, during the selective etch, a portion of the first region in the recess is etched, the selective etch including:
(i) performing a first step using a fluorocarbon gas from the gas supply to form a fluorocarbon deposit on the substrate by supplying the fluorocarbon gas and an oxygen gas during the first step and by supplying at least one of an inert gas and a noble gas during the first step;
(ii) after the first step, performing a second step of etching the first region in the recess in which fluorocarbon radicals from the fluorocarbon deposit etch the first region in the recess to remove portions of the first region from the recess and stopping supply of the fluorocarbon gas and the oxygen gas during the second step while continuing to supply the at least one of an inert gas and a noble gas.

6. The substrate processing apparatus according to claim 5,
wherein the power supply includes a first power supply having a first frequency which supplies a plasma generating power and a second power supply having a second frequency which supplies a biasing power, and the second frequency is different from the first frequency, and
wherein the controller is configured to control the first power supply and the second power supply to:
provide a plasma generating power by the first power supply during the first etching that is greater than plasma generating power by the first power supply during the first step to form the fluorocarbon deposit; and
provide a biasing power by the second power supply during the first etching that is greater than biasing power supplied by the second power supply during the first step to form the fluorocarbon deposit.

7. The substrate processing apparatus according to claim 5, wherein the controller is further configured to:
repeat the selective etch including repeatedly alternating the first step and the second step; and
before the selective etch is first performed, perform the first etching and stop the first etching prior to exposure of the second region such that when the selective etch is first performed, a predetermined thickness of the first region is present on the second region.

8. The substrate processing apparatus according to claim 7, wherein the controller is further configured to supply an oxygen gas from the gas supply to the processing container during at least part of the selective etch such that throughout repeating of the selective etch, the oxygen gas reduces an amount of the fluorocarbon deposit to prevent blockage of an opening formed by etching of the first region.

9. A substrate processing apparatus, comprising:
a processing container; a substrate support inside the processing container, and which holds a substrate during processing;
a controller configured to control the apparatus to:
(a) perform a first etching of an upper portion of a first material of the substrate,
(b) after the first etching, to perform a second etching comprising alternately repeating a first step and a second step in which:
(i) the first step includes forming a fluorocarbon deposit on the first material while supplying a fluorocarbon gas and an oxygen gas to the processing container; and
(ii) the second step incudes supplying an inert gas or a noble gas to the processing container and discontinuing supply of the fluorocarbon gas and oxygen gas, and etching a lower portion of the first material with a plasma generated from the inert gas or the noble gas.

10. The substrate processing apparatus according to claim 9, wherein the controller is configured to decrease at least one of a plasma generating power or a biasing power during the second etching compared to a plasma generating power or a biasing power during the first etching.

11. The substrate processing apparatus according to claim 9, wherein the controller is configured to:
stop the first etching prior to exposure of a second material of the substrate, and then perform the second etching such that the second material is exposed during the second etching; and
decrease both a plasma generating power and a biasing power during at least part of the second etching compared to a plasma generating power and a biasing power during the first etching.

* * * * *